United States Patent [19]

Arndt et al.

[11] Patent Number: 5,204,917
[45] Date of Patent: Apr. 20, 1993

[54] MODULAR HEARING AID

[75] Inventors: Horst Arndt; Edward S. Kroetsch, both of, Kitchener; Terrence D. Spencer, Clarksburg; Fred J. Stork, Waterloo, all of Canada

[73] Assignee: Unitron Industries Ltd., Kitchener, Canada

[21] Appl. No.: 686,368

[22] Filed: Apr. 17, 1991

[30] Foreign Application Priority Data

Apr. 19, 1990 [CA] Canada .................................. 2014960

[51] Int. Cl.⁵ .............................................. H04R 25/02
[52] U.S. Cl. ........................................ 381/69; 381/68; 381/68.7
[58] Field of Search ........................... 381/69, 68.7, 68

[56] References Cited

U.S. PATENT DOCUMENTS

| | | | |
|---|---|---|---|
| 4,870,688 | 9/1989 | Voroba et al. | 381/69 |
| 4,965,831 | 10/1990 | Schmid | 381/69 |
| 5,001,762 | 3/1991 | Barwig et al. | 381/68.4 |

Primary Examiner—Jin F. Ng
Assistant Examiner—Edward Lefkowitz
Attorney, Agent, or Firm—Bereskin & Parr

[57] ABSTRACT

A modular hearing aid having separate microphone, receiver, amplifier and battery modules. The microphone module is connected to the receiver module by two dovetails. The receiver module is connected to the amplifier module by one dovetail and to a forwardly projecting plate of the battery module by another dovetail. The amplifier module is connected to the battery module by another dovetail. A flexible circuit board of the amplifier module has a flap which extends over part of the receiver module and is soldered to pins projecting therefrom. The pins extend within the receiver housing and are connected to the receiver therein. Another flap of the circuit board extends over part of the battery module and is soldered to connections on the battery module. Another flexible circuit board extends from the amplifier module over the receiver module and is connected to pins on the microphone module housing. Cover plates cover the top and bottom of the assembled modules to provide a cosmetically attractive appearance.

16 Claims, 6 Drawing Sheets

MODULAR HEARING AID

FIELD OF THE INVENTION

This invention relates to a modular hearing aid of the kind which normally fits behind the user's ear.

BACKGROUND OF THE INVENTION

Hearing aids are traditionally manufactured by electrically connecting together an amplifier, transducers and battery contacts and then packaging this assembly of components into a suitable shell. The shell is tooled specifically to house these components and to protect them from the environmental stresses encountered in day to day use. The performance of a hearing aid is dependent on the integrity of the shell and its ability to provide acoustic isolation between the transducers, protection for the transducers against shock, and protection of all hearing aid components from environmental elements such as moisture and corrosive materials contained in the atmosphere, perspiration, and cosmetic fluids, sprays and powders. While suitable protection may be supplied by a particular hearing aid shell, the need to service the hearing aid components will occasionally require the shell to be opened, thus at the same time compromising the protection provided by the housing.

In addition, it is sometimes necessary to repair a hearing aid, and the repair process may require replacement of components. When all of the components are interconnected together as one assembly, replacement of parts can be difficult and time consuming.

As a result of the above problems, various attempts have been made to produce modular hearing aids. Such attempts are shown for example in West German Gebrauchsmuster Nos. G8908003.3 filed Jun. 30, 1989, G8804745.8 filed Apr. 11, 1988, G8804743.1 filed Apr. 11, 1988, West German Offenlegungsschrift DE 3502178A1 filed Jan. 23, 1985, and European patent application 0303143 filed Jan. 8, 1988. The above documents show various approaches which have been taken to divide the hearing aid into sections. However these proposals leave much to be desired in terms of mechanical strength, ease of connecting and disconnecting the various sections, and an ability to provide various desired cosmetic treatments to the hearing aid as a whole, a matter which is of great importance to users.

SUMMARY OF THE INVENTION

It is therefore an object of this invention to provide a modular hearing aid in which the major components are individually packaged and yet are ruggedly connected together in a manner which allows for ease of assembly and speedy repair. In one aspect the present invention provides a modular hearing aid comprising:

(a) a microphone module having a microphone therein, (b) a receiver module having a receiver therein, (c) an amplifier module having an amplifier therein, (d) a battery module adapted to receive a battery, (e) said modules being removably connected together by dovetail connections, (f) and a pair of cover plates, one on each side of said hearing aid, said cover plates being removably connected to said assembled modules and substantially covering said modules to help seal said modules against ingress of moisture, dust and the like and to provide a changeable cosmetically attractive appearance for said hearing aid.

Further objects and advantages of the invention will appear from the following description, taken together with the accompanying drawings.

DETAILED DESCRIPTION OF PREFERRED EMBODIMENT

Figure 1A:
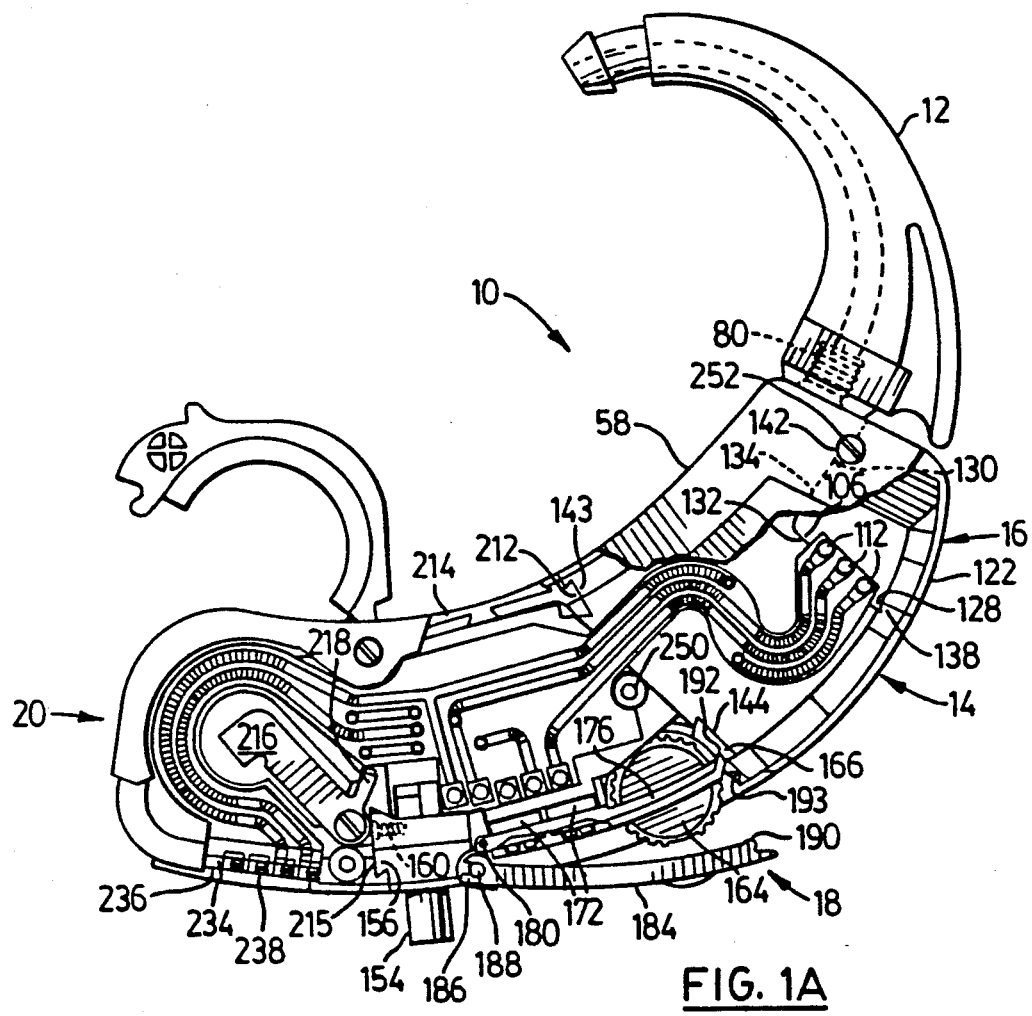
FIG. 1A is a top plan view of a hearing aid according to the invention with the modules assembled together.
Figure 1B:
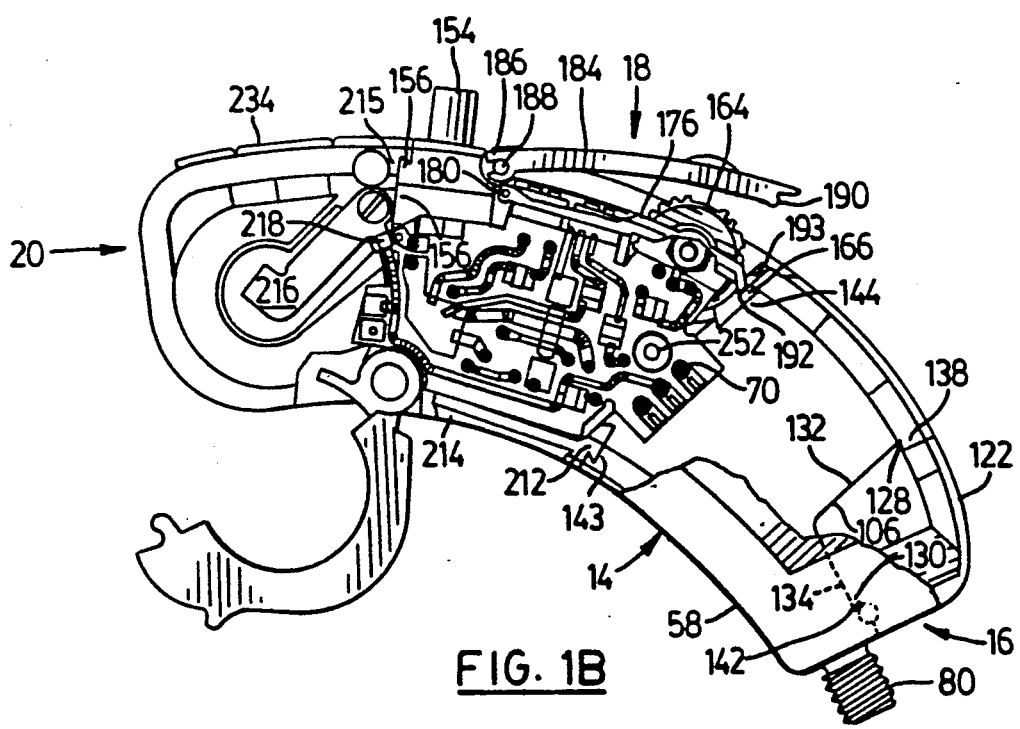
FIG. 1B is a bottom plan view of the hearing aid of FIG. 1A.
Figure 2:
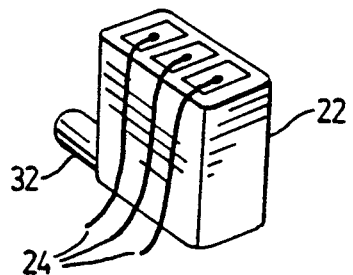
FIG. 2 is a perspective view of a receiver for use with the invention.
Figure 3:
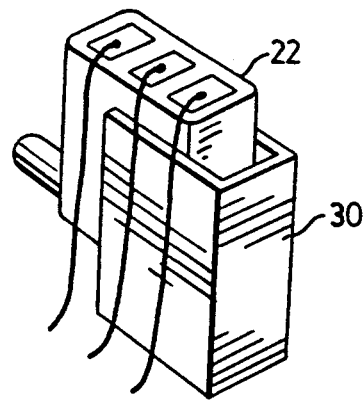
FIG. 3 is a perspective view of the receiver of FIG. 2 with magnetic shielding being installed around it.

Reference is first made to FIGS. 1A and 1B, which show a hearing aid 10 according to the invention. The hearing aid 10 is formed of five main sections, namely an earpiece 12, a receiver module 14, a microphone module 16, an amplifier module 18, and a power or battery module 20.

The receiver module 14 is assembled as shown in FIGS. 2 to 7 inclusive. Specifically, a receiver 22 (which is in fact a small loudspeaker) having three wires 24 connected thereto, is firstly inserted into a standard magnetic shield 30 which protects it on four sides. The front of the receiver 22 is not shielded because of a metal sound tube 32 which projects therefrom, and the top is not protected because of the contacts located there for the wires 24.

Figure 4:
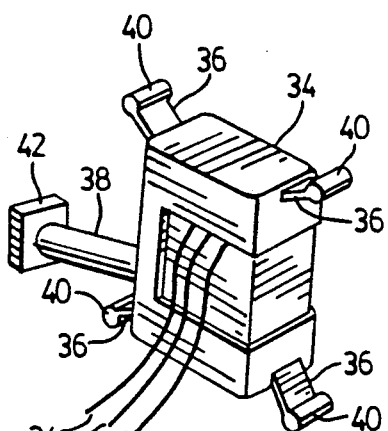
FIG. 4 is a perspective view of the receiver of FIG. 3 with a five point rubber suspension sleeve installed over it.
Figure 5:
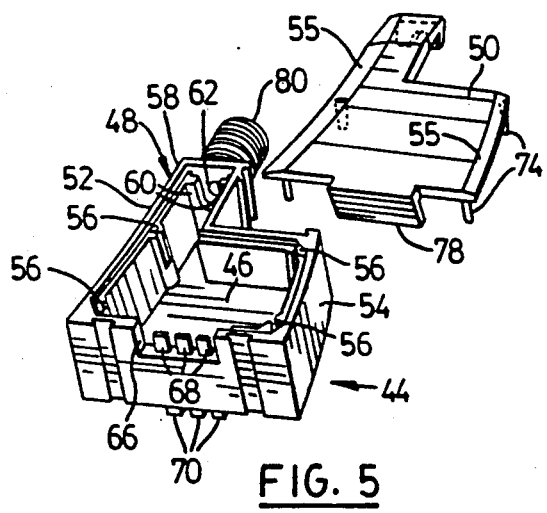
FIG. 5 is a perspective view of a receiver module housing and lid according to the invention.

The receiver 22, shielded as shown in FIG. 4, is next inserted into a resilient sleeve 34. The sleeve is of rubber or an elastomer and contains five projections. One projection 36 extends from each corner of sleeve 34, and a fifth tubular projection 38 covers and extends from the sound tube 32. Each projection 36 ends in an enlarged rounded tip 40. However projection 38 ends in a squared block 42.

The receiver 22, encased in sleeve 34, is next lowered into a housing 44 (FIG. 5) which forms the outer surface of the receiver module. The housing 44 is molded from plastic and has a generally flat bottom 46, a side wall 48, and a generally flat topped lid 50. The left and right portions 52, 54 of the sidewall 48 form portions of the sides of the hearing aid when assembled with the remaining modules (to be described) and are contoured for cosmetic appearance. The bottom (not shown) of the housing and its lid have sloped edges 55 to accommodate cover plates to be described.

The housing 44 includes four internal tubular holes 56 to receive and retain the rounded tips 40 of the sleeve 34, and also includes an elongated portion 58 for the tubular projection 38. The elongated portion 58 includes, near its tip, internally opposed stub walls 60 having a slot 62 therebetween to receive and trap the square end 42 of the tubular projection 38.

The rear wall 64 of the housing opposite the elongated portion 58 contains a recess 66 in its upper edge. Three flat metal pins 68 project from the upper edge of the recess 66. The pins 68 also extend downwardly through the wall 64 and project from the bottom of the housing as shown at 70 in FIGS. 5 to 7.

Figure 6:
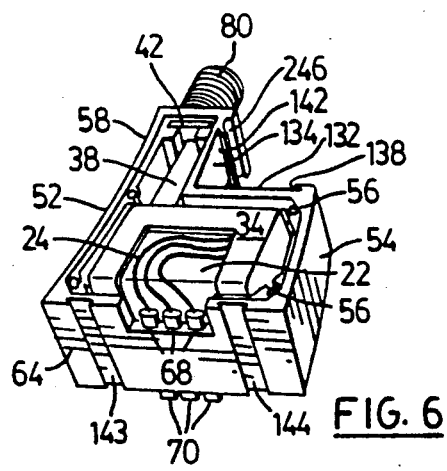
FIG. 6 is a perspective view of the receiver housing of FIG. 5 with the receiver inserted therein.

In use, the receiver 22 wrapped in its resilient sleeve 34 is installed in the housing 44 as shown in FIG. 6. The wires 24 are then soldered to the pins 68 in the recess 66. The lid 50 is then snapped into place by means of plastic pins 74 which extend downwardly from the edges of the lid and which are received in the top portions of the same holes 56 in housing 44 which receive the resilient tips 40. A tab 78 extending downwardly from the lid 50 closes the recess 66 and covers the pins 68 where they connect to the wires 24. The complete receiver module 14 is now ready to be installed in the hearing aid.

Projecting from the elongated portion 58 of the housing 44 is a threaded sound spout 80 which communicates internally with the internal passage in tubular projection 38. The earpiece 12 has an inner matching thread so that it can be screwed onto the sound spout 80 as shown in FIG. 1A.

If desired, the one-piece resilient sleeve 34 can be replaced by four separate pieces, one fitted over each corner of the receiver 22 and each having a projecting tip shown at 36, 40. In that case a separate resilient tube would be used in place of tubular projection 38.

Figure 8:
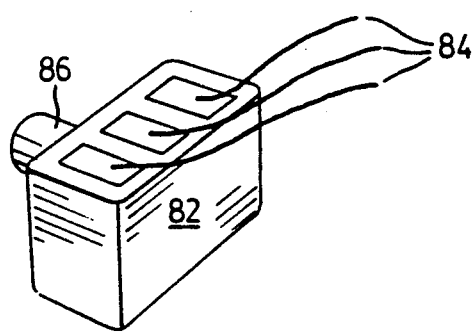
FIG. 8 is a perspective view of a microphone for use with the invention.
Figure 9:
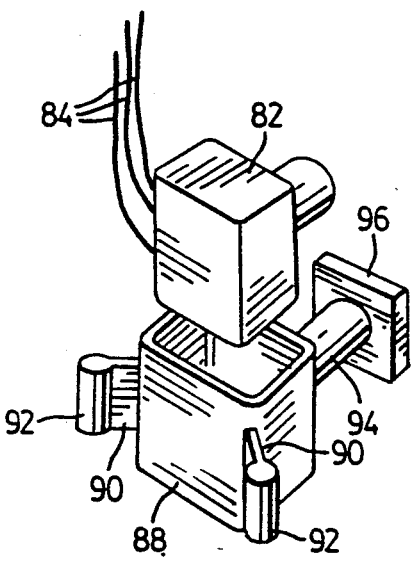
FIG. 9 is a perspective view of the microphone of FIG. 8 being inserted into a suspension therefor.
Figure 10:
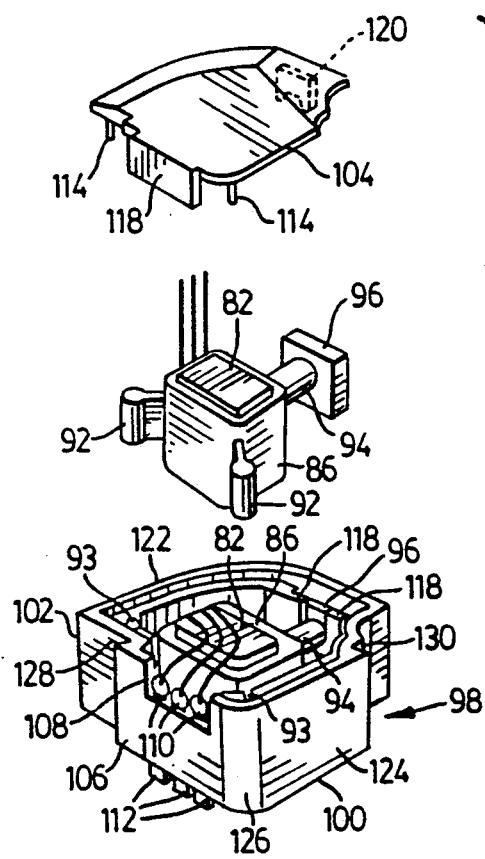
FIG. 10 is a perspective view of the microphone and suspension inserted in a microphone module housing with a lid ready to close the module.
Figure 11:
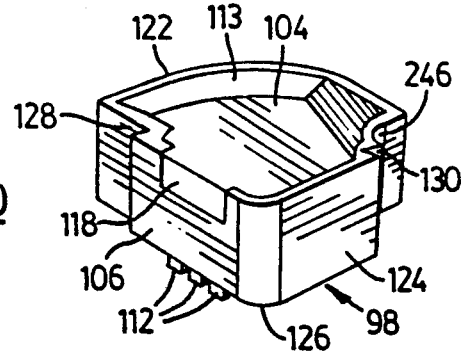
FIG. 11 is a perspective view of the microphone module housing of FIG. 10 with its lid closed.

The microphone module 16 will next be described, with reference to FIGS. 8 to 11. In FIG. 8 a conventional microphone is shown at 82, having three wires 84 connected thereto and having a microphone sound tube 86. The microphone 82 is placed in a resilient suspension sleeve 88 as shown in FIG. 9. The sleeve 88 (which may be of rubber or elastomer) has two projections 90 at two rear corners thereof and which end in enlarged rounded tips 92. At its front the sleeve 88 has a forwardly extending resilient tube 94 which covers the microphone tube 86 and ends in a squared block 96.

The microphone 82 in its sleeve 88 is fitted into a microphone housing 98 formed of molded plastic and having a generally flat bottom 100, a sidewall 102, and a generally flat topped upper lid 104. The sidewall 102 has a rear wall 106 which contains a recess 108 in its upper edge. Three flat metal pins 110 project upwardly into the recess 108 and also extend downwardly through the rear wall 106 and project from the bottom 100 as shown at 112. The wires 84 are soldered to the pins 110 in the recess 108. The tips 92 of the resilient projections 90 are received in tubular holes 93 at the inside rear corners of the housing 98, and the tube 94 extends forwardly so that its squared front end 96 is trapped between two inwardly opposed wall portions 118 at the front of housing 98. The inside passage of tube 94 communicates with a port (not shown) in the front wall of housing 98, for sound to reach the microphone 82. The housing and lid are shaped to accommodate the microphone on the inside and have sloped outer edges 113 to accommodate the cover plates on the outside.

The lid 104 is then snapped into place by plastic pins 114 thereon which fit into the tops of the same holes 93 in the housing 98 which receive tips 92. A tab 118 projecting downwardly from the rear of lid 104 closes the recess 108 and covers the pins 110 in the recess. A downwardly extending projection 120 near the front of the lid contacts the top of tube 86 and prevents it from rising.

The microphone module 16 is connected to the receiver module 14 by dovetails. Specifically, the microphone module housing sidewall 102 includes an outer wall portion 122 which forms part of the outer wall of the assembled hearing aid, the previously mentioned rear wall 106, and an inner wall portion 124. The wall portions 106, 124 join each other at a rounded corner 126 and join the outer wall portion 122 at dovetails 128, 130.

The sidewall 48 of the receiver module housing contains a front wall portion 132 and an inner wall portion 134 (which forms part of the elongated portion 58) and which meet in a corner 136. Wall portions 132, 134 are shaped to match the shape of the walls 106, 124 of the microphone module housing. The front wall portion 132 of the receiver module housing contains a dovetail 138 near the side 54 of the receiver module. The dovetail 138 cooperates with the dovetail 128 of the microphone module housing 98. The inner wall portion 134 of the receiver module housing contains a dovetail 142 near its front and which cooperates with dovetail 130 of the microphone housing module.

Thus, as shown in FIGS. 1A, 1B, the dovetails 128, 130 of the microphone module 16 can simply be slid into the dovetails 138, 142 of the receiver module 14 and will remain in position there (pending final assembly), because of the tightness of the fit between the parts.

For a similar purpose, the rear wall 64 of the receiver module housing contains two dovetail grooves 143, 144. Grooves 143, 144 are used to connect the receiver module 14 to the amplifier module 18 and to the battery module 20, as will be described.

Figure 12:
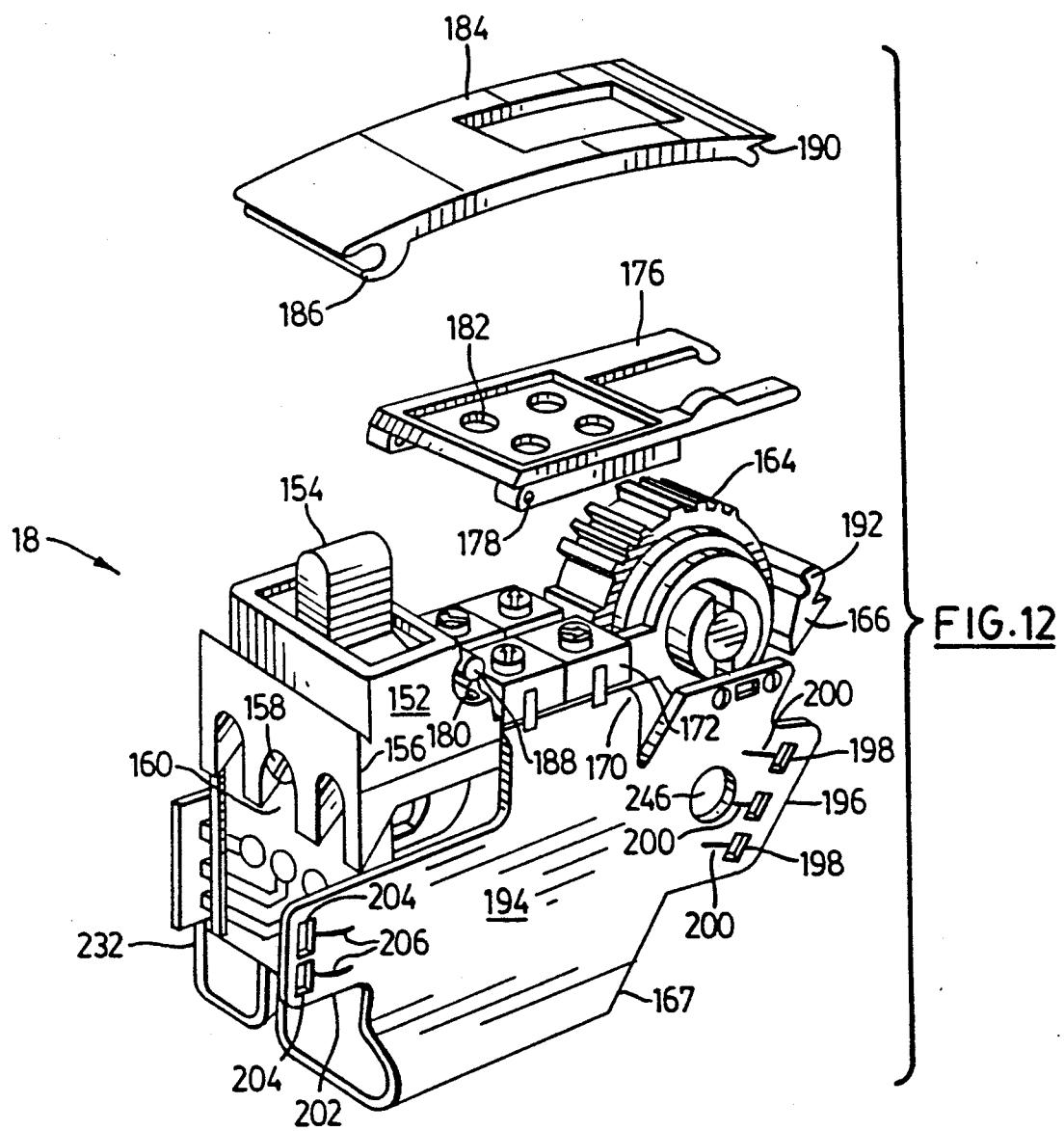
FIG. 12 is a perspective view of an amplifier module for the hearing aid of FIG. 1A.
Figure 13:
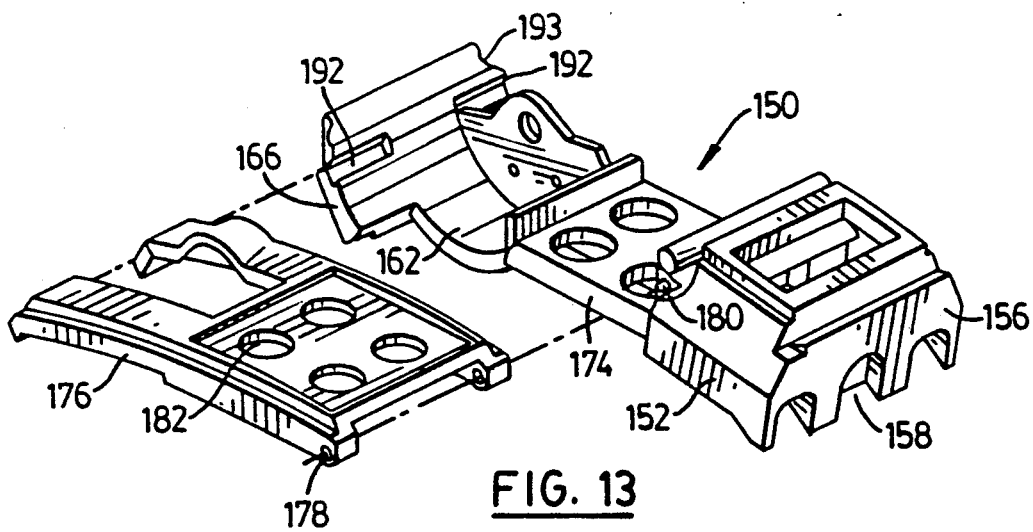
FIG. 13 is a perspective view of a frame for the amplifier module of FIG. 12.
Figure 14:
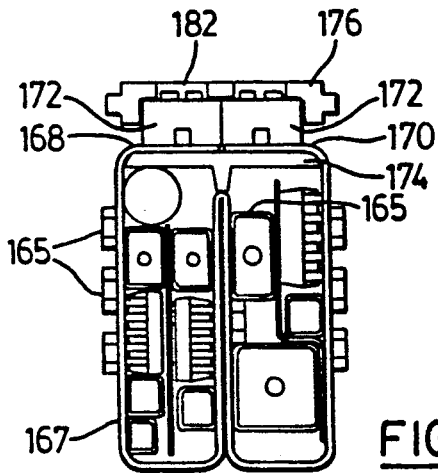
FIG. 14 is an end view of a flexible printed circuit board for the amplifier module of FIG. 12.

The amplifier module 18 and certain parts thereof are shown in FIGS. 1 and 12 to 14. The amplifier module 18 contains (as best shown in FIG. 13) a molded plastic upper frame 150 which extends the full length of the amplifier module. At its rear end the frame 150 includes a molded plastic box 152 to house an on-off switch 154. The rear end of the box 152 includes a dovetail 156 to connect to the battery module 20 as will be described. A hole 158 in the rear surface of dovetail 156 accommodates a screw 160 which secures the switch 154 in position.

The other end of the frame 150 includes a molded plastic bearing structure 162 to house and rotatably support a rotary volume control 164. The front end of the bearing structure 162 includes a male dovetail 166 shaped to fit snugly within the dovetail groove 144 in the rear end of the receiver module housing 44.

Electronic components 165 (which form an amplifier) of the amplifier module 18 are mounted on a flexible circuit board 167 (FIG. 14) folded into a "W" shape (as seen from the end) and having inwardly projecting upper ends 168, 170 each carrying two adjustable potentiometers 172. The upper ends 168, 170 are folded over and supported on the central portion 174 of the frame 150 and are held in place by a molded plastic retainer plate 176 (FIG. 12). Plate 176 snap-fits onto the box structure 152 by means of holes 178 at the end of plate 176 which snap into small pins 180 (FIG. 13) molded onto the box structure 152. At its opposite end plate 176 snaps into the recess 192.

The plate 176 contains holes 182 which overlie the potentiometers 172 so that a technician can adjust the potentiometers 172 as required. A cover plate 184 (FIGS. 1A, 1B, 12) is provided, having forks 186 at one end thereof to snap over pin 188 molded in frame 150. The cover plate 184 can be pivoted about pin 188 to expose the potentiometers 172 for adjustment, and can be snapped into its down position to cover potentiometers 172. Cover plate 184 is held in its down position by a dovetail 190 which fits releasably beneath lip 193 at the front end of frame 150.

As shown in FIG. 12, one side 194 of circuit board 167 includes a front flap 196 having three openings 198 therein. Circuit tracks shown diagrammatically at 200 and which form part of the amplifier circuit extend on printed circuit board 167 to the openings 198. When the hearing aid is assembled, the three openings 198 fit over the three projecting pins 70 of the receiver module and are soldered thereto. This connection both forms electrical connections between the amplifier and receiver modules and helps hold the amplifier and receiver modules mechanically together. The soldered connections can easily be unsoldered if repairs are needed.

The side 194 of the circuit board 167 also contains a rearwardly extending flap 202 containing two openings 204 therein. Circuit tracks shown diagrammatically at 206 and forming part of the amplifier circuit extend to the openings 204. The openings 204 are adapted to fit over tabs 218 extending from the battery module 20, as will be described.

Figure 15:
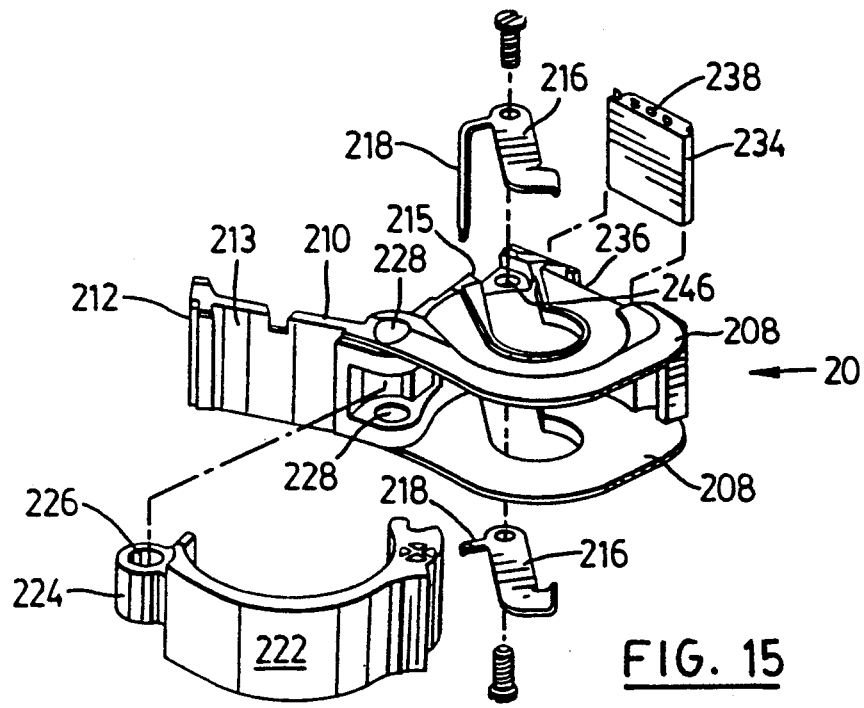
FIG. 15 is a perspective view of the battery module for the hearing aid of FIG. 1A.

The battery module 20 is of molded plastic and is shown in FIG. 15. The module 20 includes side plates 208 extending rearwardly from and integrally connected to an upper and forwardly extending plate 210. The plate 210 terminates at its front end in a male dovetail 212 which fits into the dovetail groove 143 in the rear wall of the receiver housing 44. In its outer surface the plate 210 includes a dovetail groove 213 into which a model identification plate 214 (FIGS. 1A, 1B) can be slid, to identify the hearing aid in question.

Similarly, the side plates 208 each have at their front end a female dovetail 215 (see also FIG. 1A) which accommodates the male dovetail 156 in the rear end of the box 152 of the amplifier module 18. Thus the battery module 20 is securely mechanically connected both to the amplifier module 18 and to the receiver module 14, helping to lock all three modules together. It will be noted that the dovetails contain stops (not shown) which prevent the modules from being pushed too far and hence ensure their alignment.

Battery contacts 216 (FIG. 15) are provided, each having a tab 218 projecting from its side. The tabs 218 are soldered to circuit tracks (indicated diagrammatically at 206 in FIG. 12) which tabs 218 extend from one side plate 208 of the battery module. The holes 204 in circuit board rear flap 202 fit over the tabs 218, so that the circuit board 167 can be soldered to the tabs 218 to provide an electrical connection between the battery and amplifier modules.

A conventional pivoted battery door 222 is provided to receive a battery and to insert the same into the battery module 20. The battery door 222 includes a rounded end 224 having a pivot hole 226 aligned with pin holes 228 in the battery module side plates 208. A pin (to be described) is inserted through the respective holes 226, 228 to mount the door 222 to the battery module 20.

Figure 16:
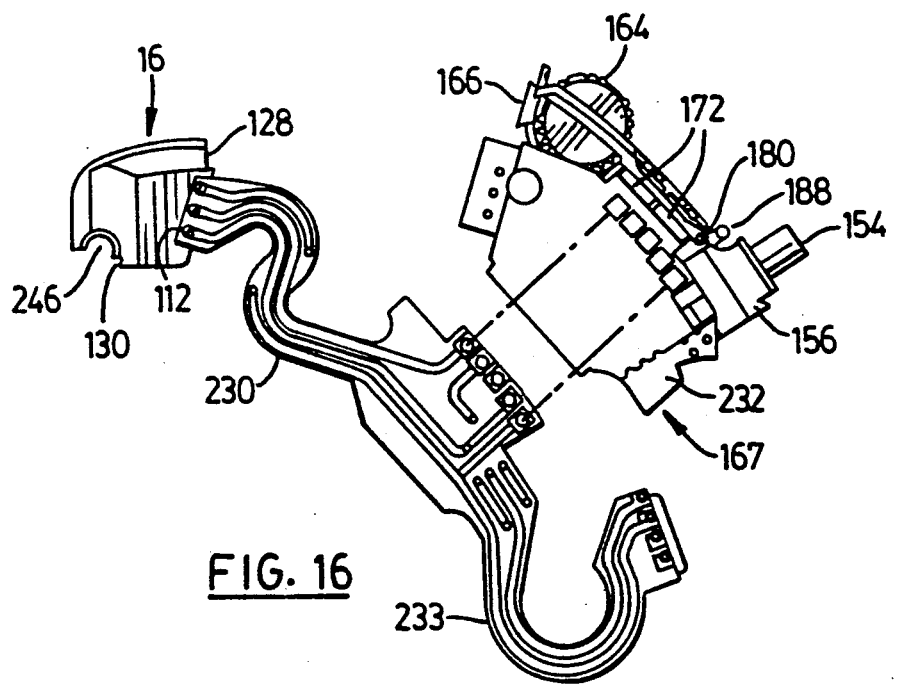
FIG. 16 is a perspective view showing a flexible wiring sheet connecting the microphone and amplifier modules and having an optional connection for direct electrical input to the battery module.

The microphone module 16 is connected to the amplifier module 18 by a separate flexible circuit board 230 shown in FIG. 16. The circuit board 230 is soldered to the microphone module pins 112 and is also soldered to side 232 of the circuit board 167, just below the potentiometers 172. If desired, and as shown in FIG. 16, the flexible circuit board 230 can extend rearwardly as shown at 233 and can be connected to a connection plate 234 (FIGS. 1A, 1B, 15) in the battery module. The connection plate 234 is T-shaped in cross-section and slides into a slot 236 in the battery module (the slot 236 is otherwise filled by a filler plate, not shown) and contains connections 238 for a separate audio input to the hearing aid (and for separate power to the hearing aid if desired).

Figure 17:
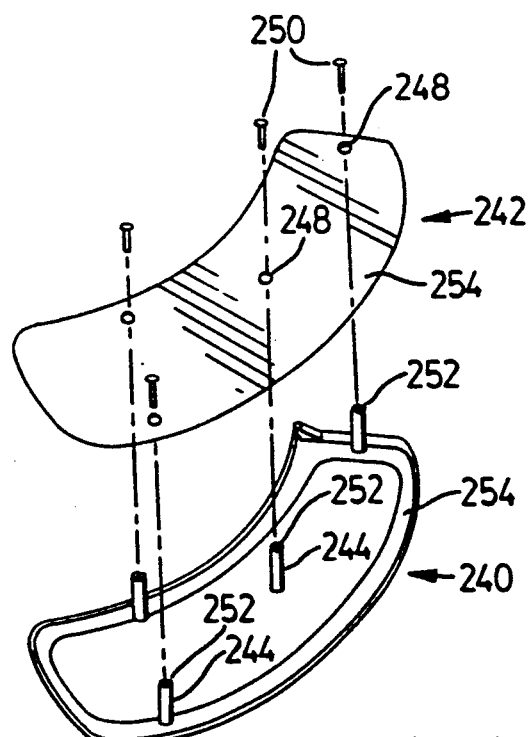
FIG. 17 is a perspective view showing cover plates for the hearing aid of FIG. 1A.

After the hearing aid has been assembled as shown in FIG. 1, cover plates 240, 242 (FIG. 17), which also extend generally in the plane of the hearing aid, are snapped into position to cover the exposed sides, top and bottom of the assembled aid. Cover plate 240 contains four pins 244 which extend through holes 226, 228, 246 in the assembled hearing aid and which are aligned with matching holes 248 in the cover plate 242. Screws 250 may be inserted through the holes 248 into openings 252 in the pins 244 to secure the cover plates to the hearing aid. The cover plates enable a desired cosmetic treatment to be given to the hearing aid while using standard modules in the hearing aid. The cover plates also seal the modules against sweat, moisture, dust and the like. The edges of the cover plates are also slightly sloped inwardly as shown at 254, for cosmetic appearance and to help hold the modules in position.

Figure 7:
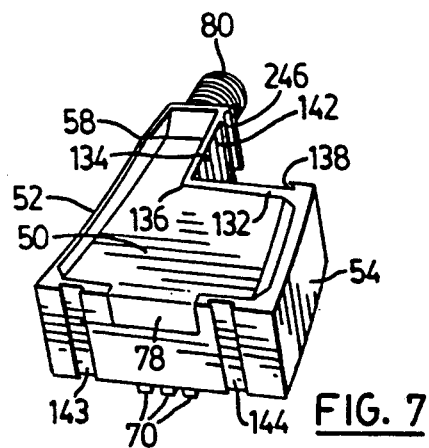
FIG. 7 is a perspective view of the receiver housing of FIG. 6 with its lid thereon.

In summary, it will be seen from the drawings that the various modules, namely the microphone module, receiver module, amplifier module and battery module, are connected together by the following dovetails. Microphone module dovetails 128, 130 (FIGS. 1A, 11) are connected respectively to receiver module dovetails 138, 142 (FIGS. 1A, 7). Receiver module dovetails 143, 144 (FIGS. 1B, 7) are connected respectively to the battery module dovetail 212 (FIGS. 1B, 15) and the amplifier dovetail 166 (FIGS. 1A, 12). Finally, the amplifier dovetail 156 (FIGS. 1B, 12) is connected to batter module dovetail 215 (FIGS. 1A, 15). It will be clearly seen from the drawings that each dovetail connection between a pair of connected modules consists of a first surface on one of the connected modules defining a slot having a neck of first width and an interior of second width greater than the first width, and a projection on the other of the connected modules shaped to fit snugly and slidingly into the slot, the projection having an outer surface of third width corresponding to the second width and the projection having a neck of fourth width corresponding to the first width. It will also be clearly seen from the drawings that all of the dovetail connections extend parallel to each other, with their ends being covered by the cover plates 240, 242.

We claim:

1. A modular hearing aid comprising:
   (a) a microphone module having a microphone therein,
   (b) a receiver module having a receiver therein,
   (c) an amplifier module having an amplifier therein,
   (d) a battery module adapted to receive a battery,
   (e) said modules having removably connected together by dovetail connections, each dovetail connection between a pair of connected modules comprising a first surface on one of said connected modules defining a slot having a neck of first width and an interior of second width greater than said first width, and a projection on the other of said connected modules shaped to fit snugly and slidingly into said slot, said projection having an outer surface of third width corresponding to said second width and said projection having a neck of fourth width corresponding to said first width, said dovetail connections all extending in a direction substantially parallel to each other, said dovetail connections having ends,
   (f) and a pair of cover plates, one on each side of said hearing aid, said cover plates covering said modules and said ends of said dovetail connections and being removably connected to said assembled modules and substantially covering said modules to help seal said modules against ingress of moisture, dust and the like and to provide a changeable cosmetically attractive appearance for said hearing aid.

2. A hearing aid according to claim 1 wherein said modules each have edge walls which together form outer edge walls of said hearing aid, said outer edge walls extending between said cover plates and said cover plates being spaced apart by said outer edge walls.

3. A hearing aid according to claim 2 wherein said microphone module is removably connected to said receiver module by a dovetail connection, said amplifier module is removably connected to said receiver module by a dovetail connection, said battery module is removable connected to both said receiver and amplifier module by dovetail connections, said hearing aid including electric circuit means interconnecting said modules.

4. A hearing aid according to claim 3 wherein said receiver module includes resilient protection means over said receiver, said protection means having a plurality of resilient projections therefrom, said receiver module further including a housing, said housing being adapted to receive said sleeve with said resilient projections contacting said housing and assisting to acoustically isolate said receiver from the remainder of said hearing aid.

5. A hearing aid according to claim 1 wherein said microphone module includes a housing, resilient protection means over said microphone, said protection means having resilient projections extending therefrom, said projections contacting said housing for improved acoustic isolation of said microphone from the remainder of said hearing aid.

6. A hearing aid according to claim 1 wherein said battery module contains connection means adapted to receive a direct electrical input.

7. A modular hearing aid comprising:
   (a) a microphone module having a microphone therein,
   (b) a receiver module having a receiver therein,
   (c) an amplifier module having an amplifier therein,
   (d) a battery module adapted to receive a battery,
   (e) said microphone module being removably connected to said receiver module by a dovetail connection, said amplifier being removably connected to said receiver module by a dovetail connection, said battery module being removably connected to both said receiver and amplifier modules by dovetail connections, and hearing aid including electric circuit means interconnecting said modules,
   (f) said circuit means including a flexible printed circuit board forming a part of said amplifier module and having a flap having openings therein, said receiver module having electrical connection means projecting through said openings and soldered to said flap,
   (g) a pair of cover plates, one on each side of said hearing aid, said cover plates being removably connected to said assembled modules and substantially covering said modules to help seal said modules against ingress of moisture, dust and the like and to provide a changeable cosmetically attractive appearance for said hearing aid,
   (h) said modules each having edge walls which together form edge walls of said hearing aid.

8. A modular hearing aid comprising:
   (a) a microphone module having a microphone therein,
   (b) a receiver module having a receiver therein,
   (c) an amplifier module having an amplifier therein,
   (d) a battery module adapted to receive a battery,
   (e) said microphone module being removably connected to said receiver module by a dovetail connection, said amplifier being removably connected to said receiver module by a dovetail connection, said battery module being removably connected to both said receiver and amplifier modules by dovetail connections, said hearing aid including electric circuit means interconnecting said modules,
   (f) said amplifier module including a flexible printed circuit board forming a part of said circuit means and having a flap which projects over said battery module, said flap having openings therein, said battery module having electrical connection means projecting through said openings and soldered to said flap,
   (g) a pair of cover plates, one on each side of said hearing aid, said cover plates being removably connected to said assembled modules and substantially covering said modules to help seal said modules against ingress of moisture, dust and the like and to provide a changeable cosmetically attractive appearance for said hearing aid,
   (h) said modules each having edge walls which together form edge walls of said hearing aid.

9. A modular hearing aid comprising:
   (a) a microphone module having a microphone therein,
   (b) a receiver module having a receiver therein, (c) an amplifier module having an amplifier therein,
(d) a battery module adapted to receive a battery,
(e) said modules being removably connected together by dovetail connections,
(f) a pair of cover plates, one on each side of said hearing aid, said cover plates being removably connected to said assembled modules and substantially covering said modules to help seal said modules against ingress of moisture, dust and the like and to provide a changeable cosmetically attractive appearance for said hearing aid,
(g) said receiver housing including a bottom wall, an encircling sidewall extending from said bottom wall, and an upper edge, said sidewall having a recess in said upper edge, a plurality of metal tabs extending through said sidewall and having first ends extending into said recess and second ends projecting outwardly from said bottom wall adjacent said sidewall, said first ends of said tabs being electrically connected to said receiver, and a lid removably fitted over said upper edge of said sidewall to close said housing, said lid having a flap covering said recess, said second ends of said tabs being electrically connected to said amplifier module.

10. A hearing aid according to claim 9 wherein said amplifier includes a flexible printed circuit board forming a part of said circuit means, said printed circuit board having a flap projecting over said second ends of said tabs of said receiver module, said flaps having openings therein, said second ends of said tabs projecting through said openings and being soldered to said flap.

11. A modular hearing aid comprising:
(a) a microphone module having a microphone therein,
(b) a receiver module having a receiver therein,
(c) an amplifier module having an amplifier therein,
(d) a battery module adapted to receive a battery,
(e) said modules being removably connected together by dovetail connections,
(f) a pair of cover plates, one on each side of said hearing aid, said cover plates being removably connected to said assembled modules and substantially covering said modules to help seal said modules against ingress of moisture, dust and the like and to provide a changeable cosmetically attractive appearance for said hearing aid,
(g) said microphone module including a housing, resilient protection means over said microphone, said projection means having resilient projections extending therefrom, said projections contacting said housing for improved acoustic isolation of said microphone from the remainder of said hearing aid,
(h) said housing including a bottom wall, an encircling sidewall connected said bottom wall and having an upper edge, said upper edge having a recess therein, a plurality of metal tabs extending through said sidewall and having first ends projecting into said recess and second ends projecting from said bottom wall adjacent said sidewall, said first ends being electrically connected to said microphone, said second ends being electrically connected to said amplifier.

12. A hearing aid according to claim 11 wherein said circuit means includes a flexible printed circuit board connected to said second ends of said tabs and extending over said receiver module and electrically connected to said amplifier module.

13. A modular hearing aid comprising:
(a) a microphone module having a microphone therein,
(b) a receiver module having a receiver therein,
(c) an amplifier module having an amplifier therein, said amplifier module including a switch for said hearing aid, a volume control for said hearing aid, and an amplifier for said hearing aid,
(d) a battery module adapted to receive a battery,
(e) said microphone module being removably connected to said receiver module by a dovetail connection, said amplifier being removably connected to said receiver module by a dovetail connection, said battery module being removably connected to both said receiver and amplifier modules by dovetail connections, said hearing aid including electric circuit means interconnecting said modules,
(f) a pair of cover plates, one on each side of said hearing aid, said cover plates being removably connected to said assembled modules and substantially covering said modules to help seal said modules against ingress of moisture, dust and the like and to provide a changeable cosmetically attractive appearance for said hearing aid,
(g) said modules each having edge walls which together form outer edge walls of said hearing aid.

14. An electronic module for a modular hearing aid, said module including a housing having a bottom wall, an encircling sidewall extending from said bottom wall and having an upper edge, said upper edge having a recess therein, a plurality of metal tabs extending through said sidewall and having first ends extending into said recess and second ends projecting outwardly from said bottomwall adjacent said sidewall, an electronic unit consisting of either a receiver or microphone located in said housing, said first ends of said tabs being electrically connected to said unit, and a lid removably fitted over said upper edge of said sidewall to close said housing, said lid having a flap covering said recess, said housing having dovetail connection means adapted to connect said housing to other components of said hearing aid.

15. A module according to claim 14 wherein said unit is a receiver for a hearing aid.

16. A module according to claim 14 wherein said unit is a microphone for a hearing aid.

* * * * *